(12) United States Patent  
Evans, Jr.

(10) Patent No.: US 8,494,705 B1
(45) Date of Patent: Jul. 23, 2013

(54) UNIVERSAL POWER BOX

(76) Inventor: Kenneth W. Evans, Jr., Midland, TX (US)

( * ) Notice: Subject to any disclaimer, the term of this patent is extended or adjusted under 35 U.S.C. 154(b) by 1206 days.

(21) Appl. No.: 12/352,409

(22) Filed: Jan. 12, 2009

(51) Int. Cl.
G01M 17/00 (2006.01)
G01R 31/00 (2006.01)

(52) U.S. Cl.
USPC ............ 701/29.1; 701/36; 701/102; 701/114; 324/503

(58) Field of Classification Search
USPC ............. 701/29, 36, 102, 114, 29.1; 324/503; 123/143 C, 195 E; 174/17 R, 19, 24
See application file for complete search history.

(56) References Cited

U.S. PATENT DOCUMENTS

| | | | | |
|---|---|---|---|---|
| 4,884,033 A * | 11/1989 | McConchie Sr. | ............ | 324/503 |
| 5,278,759 A * | 1/1994 | Berra et al. | ........................ | 701/1 |
| 5,442,170 A * | 8/1995 | Kreft et al. | ..................... | 250/229 |
| 5,459,660 A * | 10/1995 | Berra | ........................... | 701/29.6 |
| 5,798,647 A * | 8/1998 | Martin et al. | ................. | 324/503 |
| 6,055,468 A * | 4/2000 | Kaman et al. | .................... | 701/99 |
| 6,104,988 A * | 8/2000 | Klarer | ............................. | 702/183 |
| 6,192,302 B1 * | 2/2001 | Giles et al. | .................... | 701/29.6 |
| 6,661,237 B2 * | 12/2003 | Teich | ............................. | 324/539 |
| 6,691,023 B2 * | 2/2004 | Fujino et al. | ................... | 701/114 |
| 6,917,875 B2 * | 7/2005 | Boysen et al. | ................. | 701/114 |
| 7,248,954 B2 * | 7/2007 | Chinnadurai et al. | ........ | 701/32.7 |
| 7,505,847 B2 * | 3/2009 | Burkatovsky | ................. | 701/114 |
| 7,571,034 B2 * | 8/2009 | Raichle et al. | ............... | 701/33.2 |
| 7,991,535 B2 * | 8/2011 | Gittere | ........................... | 701/102 |
| 8,180,463 B2 * | 5/2012 | Capps et al. | .................... | 700/22 |

* cited by examiner

Primary Examiner — Mahmoud Gimie
Assistant Examiner — David Hamaoui
(74) Attorney, Agent, or Firm — Gable Gotwals

(57) ABSTRACT

A universal power box for diagnosing, programming and powering an electronic control module includes at least one diesel engine control, a universal power box connector, and a diagnostic device connector. The power box connector is in circuit relationship to the diesel engine control and an electronic control module of a diesel engine. The diagnostic connector is in circuit relationship to the power box connector and a diagnostic device, which may be a third-party diagnostic device or a computer. A first wiring harness connects the power box connector to the vehicle side of the electronic control module. A second wiring harness connects the diagnostic device connector to the diagnostic device. A power source in circuit relationship to the power box connector provides power to the electronic control module when necessary.

21 Claims, 4 Drawing Sheets

Fig.3
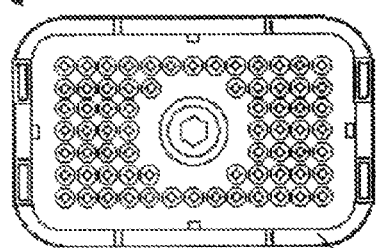
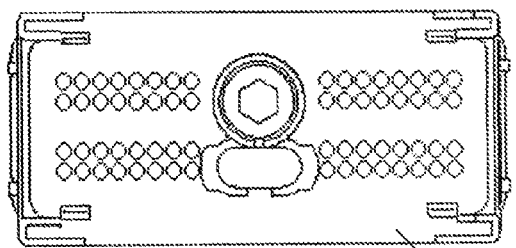
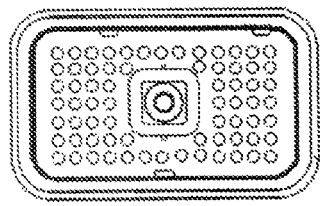
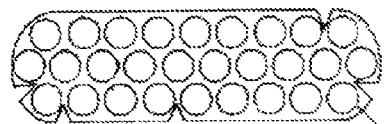
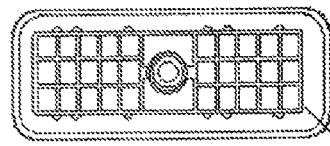

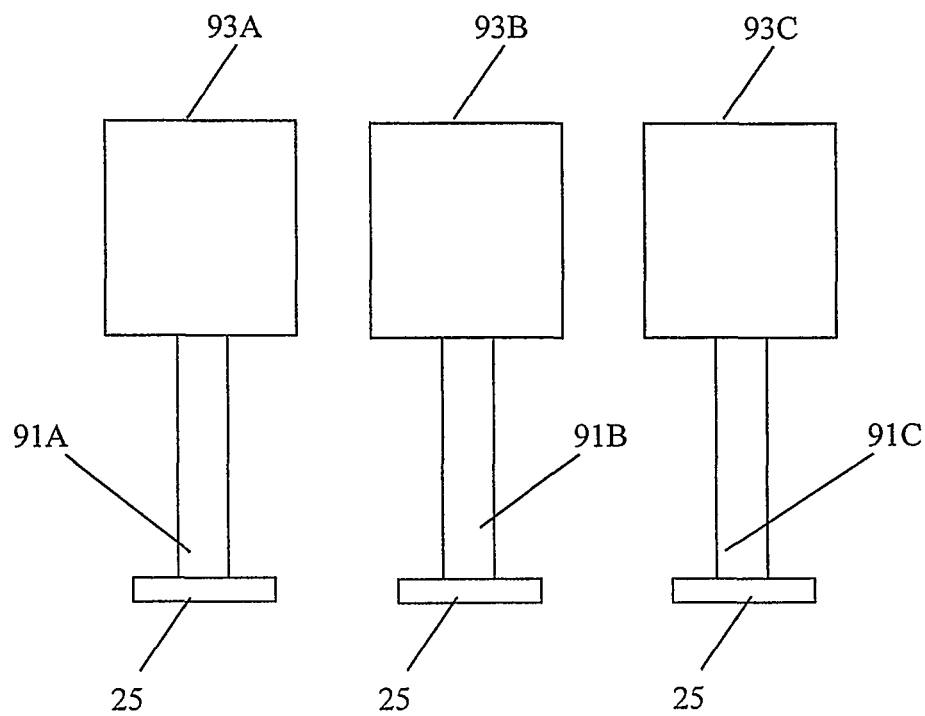
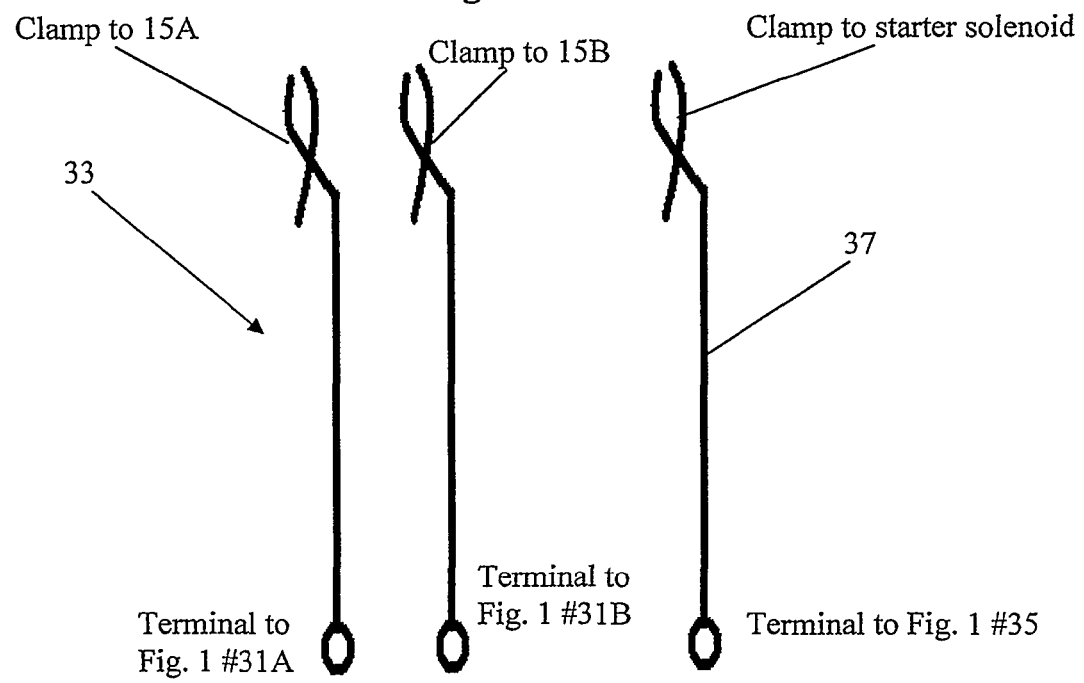

UNIVERSAL POWER BOX

FIELD OF THE INVENTION

This invention relates generally to engine diagnostic devices and, more particularly, to devices that troubleshoot the electronic control module of a diesel engine and bypass the original equipment manufacturer or vehicle side of a vehicle harness.

BACKGROUND OF THE INVENTION

Modern diesel engines employ an electronic control module or ECM that controls and monitors engine performance. Because each diesel engine manufacturer has its own unique electronic control module design and software, a manufacturer- and engine model-specific diagnostic device and connector must be used in troubleshooting engine problems and programming the electronic control module. A great many diesel mechanics are now working on these electronic diesel engines and oftentimes experience difficulty in troubleshooting them. Part of the difficulty stems from the diagnostic devices themselves.

The current diagnostic devices provided by diesel engine manufacturers—as well as third-party diagnostic devices for these diesel engines—do not bypass the vehicle harness. Instead, the devices connect to a diagnostic connector of the harness. The devices, therefore, cannot tell a mechanic whether the problem lies in the engine itself or in the vehicle harness. In many cases, the problem lies in broken wires or the vehicle harness shorting out. In other cases, the electronic control module is not receiving power from the original equipment manufacturer (OEM) vehicle harness. Furthermore, these devices rely on the OEM controls, rather than on bypassing those controls, and cannot start and run the engine. Last, the devices cannot power the electronic control module. Because the devices do not power the electronic control module, a repaired control module or a replacement control module must be installed into a vehicle in order for the module to be programmed.

The above situation is particularly problematic in oil and gas industry-related applications in which truck-mounted drilling rigs or pulling units are employed. Diesel engine power supplied by the truck is used to raise and lower the mast and to power equipment. If the diesel engine fails during the raising of the mast, or after the mast has been raised, the truck cannot be towed offsite for repair. Additional downtime often results because the diagnostic device currently available cannot be used as an emergency device to start and control the engine and lower the mast nor to quickly determine whether the problem lies in the engine itself or in the vehicle's wiring harness.

A need exists, therefore, for a device that can bypass the vehicle harness, run and control the diesel engine, power the electronic control module, and place the control module in communication with its respective diagnostic device regardless of the original equipment manufacturer for which the control module was designed.

SUMMARY OF THE INVENTION

A universal power box for diagnosing, programming and powering an electronic control module of a diesel engine while bypassing the vehicle harness includes at least one diesel engine control, a universal power box connector, and a diagnostic device connector. The power box connector is in circuit relationship to the diesel engine control and an electronic control module of a diesel engine. The diagnostic connector is in circuit relationship to the power box connector and a diagnostic device, which may be a third-party diagnostic device or a computer.

An enclosure houses the diesel engine control, the universal power box connector, and the diagnostic connector. The universal power box also includes a power source in circuit relationship to the power box connector for powering the electronic control module when necessary. The power source may be a DC power source such as the engine battery—which would provide enough amperage to start the engine—or an AC/DC power adapter may be employed.

The diesel engine control may be an ignition control, a digital throttle control, an analog throttle control, or an accessory control. The universal power box preferably includes both digital and analog throttle controls given that some diesel engines employ digital control whereas others employ analog control. One or more status indicator lights in circuit relationship to the universal power box connector may also be included.

A first wiring harness connects the universal power box connector to the electronic control module. The first end of the wiring harness connects to the universal power box connector and the second end connects to the manufacturer side of the electronic control module. The power box connector is preferably a 31-pin connector.

A second wiring harness connects the diagnostic device connector to the diagnostic device. The first end of the wiring harness connects to the diagnostic connector, which is preferably a 9-pin serial connector. The first end may include a diagnostic connector adapter that is capable of receiving a connector of at least two different diagnostic devices, each diagnostic device being for a different diesel engine manufacturer.

A method for diagnosing an electronic control module of a diesel engine includes the steps of bypassing the vehicle harness and connecting the electronic control module of a diesel engine to the universal power box so as to place the electronic control module in circuit relationship to the one or more diesel engine controls and the diagnostic device. The electronic control module may then be powered, tested, diagnosed or programmed. By employing different first harnesses, electronic control modules from different manufacturers—and different electronic control modules from the same engine manufacturer—may be diagnosed or programmed. By employing the device connector adaptor, manufacturer and third-party diagnostic devices may be placed in communication with the electronic control module. A diagnostic control may be employed to emergency stop the engine or flash diagnostic codes if the electronic control module includes an available pin for that purpose.

A better understanding of the universal power box will be obtained from the following detailed description of the preferred embodiments taken in conjunction with the drawings and the attached claims.

BRIEF DESCRIPTION OF THE DRAWINGS

FIG. 3 is an end view of the engine control module side of the wiring harness. Each original equipment manufacturer manufactures an electronic control module having a unique connector configuration and most manufacturers have multiple engine types with different electronic control modules and connectors FIG. 4 is a view of the relationship between various manufacturer-specific device connectors and an adaptor that connects to the diagnostic device connector of the universal power box.

FIG. 5 is a view of the cables connecting the battery terminals to a power source and the solenoid starter terminal to a starter solenoid of the diesel engine. The diesel engine may be powered up and run in shop without having to reinstall it in the vehicle.

DETAILED DESCRIPTION OF THE PREFERRED EMBODIMENTS

Preferred embodiments of a universal power box will now be described with reference to the drawings and the following elements:

| | |
|---|---|
| 10 | Universal power box |
| 11 | Enclosure |
| 13 | Circuitry |
| 15 | Power source |
| 20 | Connectors |
| 21 | Universal power box connector |
| 23 | Diagnostic device connector |
| 25 | Adapter |
| 27 | Diagnostic device |
| 29 | Connector |
| 31 | Battery terminals |
| 33 | Pair of cables |
| 35 | Solenoid terminal |
| 37 | Cable |
| 40 | Controls |
| 41 | Engine control module power switch |
| 43 | Accessory control switch |
| 45 | Starter control |
| 47 | Diagnostic request control |
| 49 | Digital throttle control |
| 51 | Analog throttle control |
| 60 | Indicator lights |
| 61 | Electronic control module ignition power indicator |
| 63 | Accessory indicator |
| 65 | Warning indicator |
| 67 | Stop indicator |
| 70 | Circuit protection |
| 71 | Fuse socket |
| 73 | Fuse |
| 75 | Fuse socket |
| 77 | Fuse |
| 80 | First wiring harness |
| 81 | First end |
| 83 | Second end |
| 90 | Second wiring harness |
| 91 | First end |
| 93 | Second end |

Figure 1:
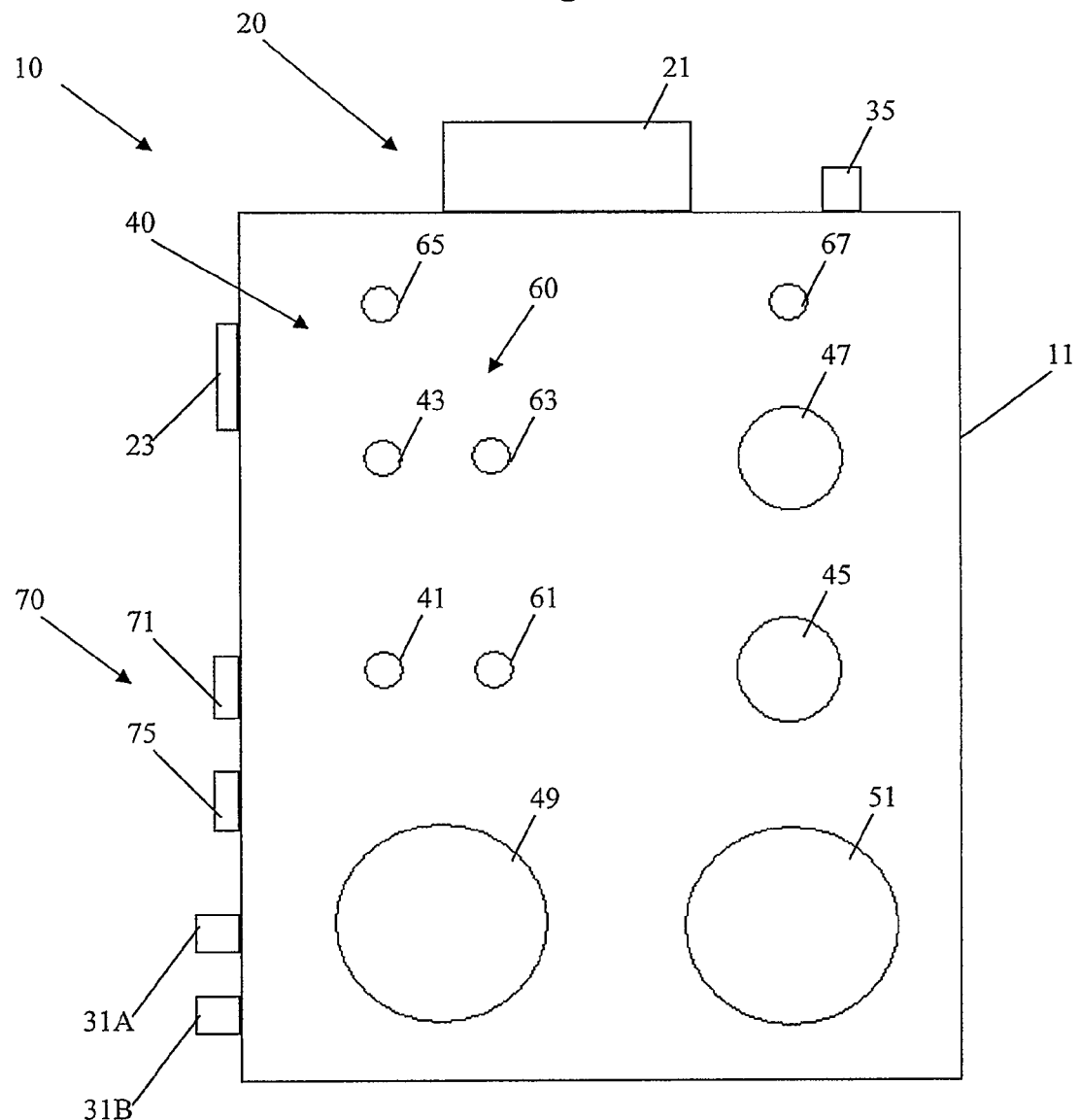
FIG. 1 is a schematic of a preferred embodiment of the universal power box. The box includes a power box connector and a diagnostic device connector as well as circuitry (see FIG. 6) that places the power box connector in circuit relationship to the diagnostic device connector. The universal power box also includes controls for controlling a predetermined performance parameter of a diesel engine. For example, a pulse width modulator or a potentiometer provides throttle control, depending on whether the diesel engine uses a digital signal to control throttle performance or an analog signal.

Referring first to FIG. 1, a universal power box 10 includes a set of connectors 20, controls 40, and indicator lights 60 housed in an enclosure 11. Connectors 20 include an electronic control module connector 21 in a circuit relationship to a diagnostic device connector 23 and a power supply 15 (see FIG. 6). In a preferred embodiment, electronic control module connector 21 is a 31-pin male DEUTSCH® connector and diagnostic device connector 23 is a 9-pin male serial connector. Controls 40 include an engine control module power switch 41, an accessory control switch 43, a starter control 45, a diagnostic request control 47, a digital throttle control 49, and an analog throttle control 51. Indicator lights 60 include an electronic control module indicator 61, an accessory indicator 63, a warning indicator 65, and a stop indicator 67. Terminals 31A and 31B provide a means for connecting power box 10 to a power source 15, and terminal 35 provides a means for connecting power box 10 to a starter solenoid (not shown). In a preferred embodiment, power source 15 is a battery connected to terminals 31A and 31B by way of cables 33. (See FIG. 5.) A cable 37 connects terminal 35 to the starter solenoid.

Figure 2:
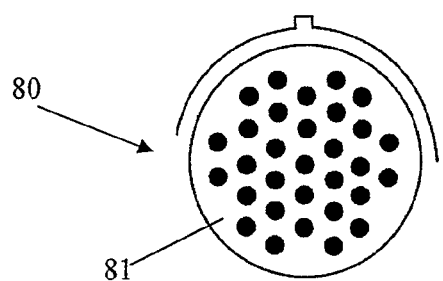
FIG. 2 is an end view of the universal power box side of a wiring harness for connecting the universal power box connector to an electronic control module of a diesel engine.

Referring now to FIGS. 2 and 3, a first wiring harness 80 has a first end 81 and a second end 83. First end 81 is a 31-pin female connector that is received by power box connector 21. In a preferred embodiment, first end 81 is a connector configured for the following pin assignments of electronic control module connector 21:

| Pin | Assignment |
|---|---|
| 1 | Battery (+) |
| 2 | Switch (+) |
| 3 | Battery (−) |
| 4 | Battery (−) |
| 5 | Ignition |
| 6 | Fuel pump (+) |
| 7 | Fuel pump (−) |
| 8 | Fuel pump control |
| 9 | Digital sensor ref 8 v |
| 10 | Digital sensor ref 0 v |
| 11 | Pulse width modulation signal |
| 12 | Sensor ref 5 v |
| 13 | Sensor common return |
| 14 | Analog throttle signal |
| 15 | Idle validation switch signal |
| 16 | Idle validation switch off signal |
| 17 | Switch common return |
| 18 | Warning lamp |
| 19 | Stop lamp |
| 20 | Engine protect lamp |
| 21 | Diagnostic request |
| 22 | (Unassigned) |
| 23 | (Unassigned) |
| 24 | (Unassigned) |
| 25 | (Unassigned) |
| 26 | Accessory switch (+) |
| 27 | Accessory switch (−) |
| 28 | J1939 (+) |
| 29 | J1939 (−) |
| 30 | Data link (+) |
| 31 | Data link (−) |

The second end 83 of first wiring harness 80 connects to the original equipment manufacturer (OEM) vehicle side of the electronic control module In a preferred embodiment, second end 83 is a connector 83A configured for use with a CATERPILLAR® C-15/3406 diesel engine control module. (See FIG. 3.) In another preferred embodiment, second end 83 is a connector 83B configured for use with a Perkins 11xxD engine control module. In yet other preferred embodiments, second end 83 is a connector 83C, 83D and 83E configured for use with a PERKINS® 11xxC diesel engine control module, a CUMMINS® CELECT™ diesel engine control module, and a DETROIT DIESEL® DDEC IV diesel engine control module, respectively.

A second wiring harness 90 connects power box 10 to a diagnostic device (not shown). The diagnostic device may be a diagnostic device specific to a particular engine control module, a general purpose diagnostic device, or a computer. In addition, the diagnostic device may provide programming capability in addition to troubleshooting capability. Second wiring harness 90 has a first end 91 for connecting to diagnostic device connector 23 of power box 10, and a second end 93 for connecting to the diagnostic device. In a preferred embodiment, first end 91A is a 9-pin female serial connector 25 and second end 93A is a 9-pin DEUTSCH® connector configured for connecting to a DETROIT DIESEL®, CUMMINS® or CATERPILLAR® diesel engine diagnostic device or compatible third-party device. (See FIG. 4.) In another preferred embodiment, second end 93B is a 9-pin DEUTSCH® connector configured for connecting to a CATERPILLAR® or PERKINS® diesel engine diagnostic device or compatible third-party device. In yet another preferred embodiment, second end 93C is a 6-pin DEUTSCH® connector configured for connecting to a diagnostic device for almost all engines.

Figure 6:
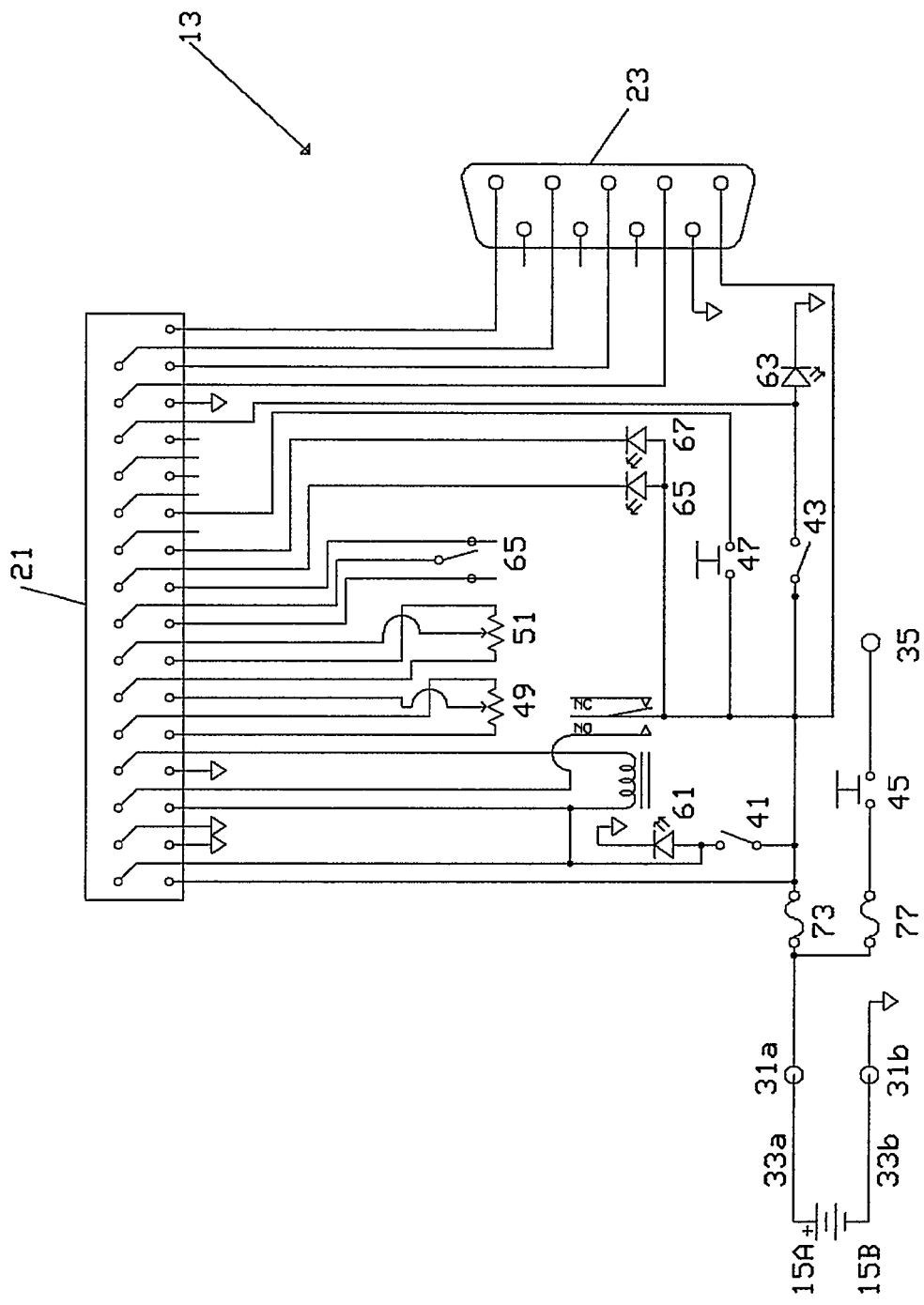
FIG. 6 is a wiring diagram of a preferred embodiment of the universal power box. The box places the electronic control module of a diesel engine in circuit relationship to a diagnostic device for troubleshooting or programming the electronic control module.

Referring now to FIG. 6, power box 10 includes circuitry 13 that places power box connector 21 in a circuit relationship to diagnostic device connector 23 and power supply 15. Circuitry 13 includes circuit protection 70. In a preferred embodiment, a 25-amp fuse 73 provides protection for the electronic control module circuit and a 30-amp fuse 77 provides protection for the start circuit. Fuses 73 and 77 are received by fuse sockets 71 and 75, respectively (see FIG. 1). Circuitry 13 enables power box 10 to run and control a diesel engine (not shown), power the electronic control module (not shown), and communicate with various diagnostic devices.

Running and controlling diesel engine performance occurs by way of controls 40. Starter control 45 is in communication with terminal 35 which, in turn, is connected by way of cable 37 to the solenoid starter, thereby providing a means to start the diesel engine either in the vehicle or on a stand outside the vehicle. Warning indicator 65, which is preferably a yellow light emitting diode, and stop indicator 67, which is preferably a red light emitting diode, provide visual control feedback from the electronic control module to a technician. Warning indicator 65 and stop indicator 67 have +12V constant and electronic control module grounds that to activate, warning/stop codes are active or if a diagnostic device request sent through starter control 45. Warning indicator 65 and stop indicator 67 are controlled by the electronic control module unless diagnostic request control 45 is activated, thereby overriding the electronic control module.

Because some diesel engines use a digital pulse width modulator signal and others use an analog signal, power box 10 preferably includes two throttle controls, a digital throttle control 49 and an analog throttle control 51. Digital throttle control 49 may be an 8v digital pulse width modulator and knob. Analog throttle control 51 may be a 5v 2.5 k potentiometer with idle validation switch and knob.

Electronic control module power switch 41 provides a means for powering the electronic control module when the control module is not installed in an engine. The electronic control module power light 61, which may be a green light emitting diode, provides an indication as to whether power is being provided by power box 10 to the electronic control module. Most electronic control modules require an unswitched constant +12V power (pin 1) to provide power during the shutdown process The switched power routes to ignition, fuel pump, and other engine control functions. When switched off, the electronic control module goes into shutdown mode, which cannot occur without any +12V power.

Power box 10 may be configured to accommodate an AC/DC power adaptor (not shown) for diagnostic purposes. A vehicle battery is required to provide the needed amperage to start the engine.

Because some electronic control modules also control engine accessories, an accessory control switch 43 is provided, along with an accessory indicator 63. Accessory indicator 63 is preferably a green light emitting diode. Diagnostic request control 47 controls accessory indicator 63.

Electronic control module power switch 41 provides a means for powering the electronic control module when the control module is not installed in an engine. The electronic control module power light 61, which may be a light emitting diode, provides an indication as to whether power in the ignition circuit is being provided by power box 10 to the electronic control module. Power box 10 may be configured to accommodate an AC/DC power adaptor (not shown).

In a preferred application of universal power box 10, the original equipment manufacturer (OEM) vehicle side of an electronic control module harness is disconnected and the second end 83 of first wiring harness 80 is connected to the OEM vehicle side. The OEM vehicle-side is the vehicle manufacturer's responsibility and runs through the vehicle. For example, in a National Oilwell Varco (Houston, Tex.) rig, National Oilwell Varco would install its harness to the OEM vehicle side. The engine side, which is diesel engine manufacturer-installed and cannot be changed, controls engine components and systems such as injectors, timing and emissions.

Because the vehicle-side harness is bypassed by universal power box 10, a technician can quickly determine whether there is a problem with the vehicle harness. Universal power box 10 may also be used to run a diesel engine that has been removed from its vehicle or to power an electronic control module that is not connected to a diesel engine. For example, if an electronic control module being held in inventory requires programming, first wiring harness 80 may be connected to the electronic control module and second wiring harness 90 may be connected to a computer.

Because universal power box 10—unlike current electronic control module diagnostic devices—bypasses the vehicle harness, power box 10 provides a mechanic with a way to quickly determine whether the problem lies in the vehicle harness or in the engine itself. In addition, power box 10 provides a small amount of diagnostics without having to rely upon a diagnostic device. If the electronic control module has logged codes or active codes, then warning light, 65 or stop indicator 67, respectively, will flash active codes when diagnostic request control 45 is actuated. Because power box 10 bypasses the engine controls and includes a starter circuit, box 10 provides an emergency device that can independently start and control the diesel engine. Last, because power box 10 includes a power circuit, box 10 can independently power the electronic control module, thereby allowing the electronic control module to be programmed or diagnosed without having to install the module in a vehicle.

The foregoing description details certain preferred embodiments of a universal power box and describes the best mode contemplated. Changes may be made in the details of construction and the configuration of components without departing from the spirit and scope of the disclosure. Therefore, the description provided herein is to be considered exemplary, rather than limiting, and the true scope of the invention is that defined by the following claims and the full range of equivalency to which each element thereof is entitled.

What is claimed is:

1. An apparatus comprising:
 a diesel engine control capable of controlling, diagnosing, programming and powering an electronic control module of a diesel engine;
 a first connector having a plurality of wiring harness ports and configured for receiving a first wiring harness, the first wiring harness putting said first connector in circuit relationship to said diesel engine control and-an original equipment manufacturer-side ("OEM-side") of an electronic control module of a diesel engine, the plurality of wiring harness ports formed to accommodate at least two differently structured first wiring harnesses;
 a second connector configured for receiving a second wiring harness, the second wiring harness putting said second connector in circuit relationship to a diagnostic device;
 means for receiving a flash code of at least one attribute of at least one of the electronic control module and the diesel engine;
 an enclosure housing said diesel engine control, said first connector, said second connector, and said receiving means; and
 means for connecting the apparatus to a power source;
 wherein the apparatus powers the electronic control module and bypasses OEM-side controls of the electronic control module.

2. An apparatus according to claim 1 further comprising the first wiring harness having a first end and a second end, said first end connecting to said first connector, said second end connecting to the OEM-side of the electronic control module.

3. An apparatus according to claim 1 further comprising said first connector being a 31-pin connector.

4. An apparatus according to claim 1 further comprising said connecting means including an AC/DC power adapter.

5. An apparatus according to claim 1 further comprising the second wiring harness having a first end and a second end, said first end connecting to said second connector, said second end connecting to the receiving means.

6. An apparatus according to claim 1 further comprising said second connector being a 9-pin serial connector.

7. An apparatus according to claim 1 further comprising a diagnostic connector adapter, said diagnostic connector adapter being capable of receiving a connector of at least two different diagnostic devices, said at least two different diagnostic devices each being a diagnostic device for a different diesel engine manufacturer.

8. An apparatus according to claim 1 further comprising said diesel engine control being selected from the group consisting of an ignition control, a throttle control, and an accessory control.

9. An apparatus according to claim 8 further comprising said throttle control being at least one of a digital throttle control and an analog throttle control.

10. An apparatus according to claim 1 further comprising at least one status indicator light in circuit relationship to said first connector.

11. An apparatus according to claim 1 further comprising said receiving means being a computer.

12. An apparatus according to claim 1 further comprising a diagnostic request control.

13. An apparatus according to claim 1 further comprising a starter control, said starter control allowing the apparatus to independently start the diesel engine.

14. A method for diagnosing an electronic control module of a diesel engine comprising the steps of:
 bypassing a vehicle side harness connected to the electronic control module; and
 connecting a vehicle side of the electronic control module to a power box including
  a power source; and
  at least one diesel engine control capable of controlling, diagnosing, programming and powering an electronic control module of a diesel engine;
  a first connector having a plurality of wiring harness ports and configured for receiving a first wiring harness, the first wiring harness putting said first connector in circuit relationship to said diesel engine control and-an original equipment manufacturer-side ("OEM-side") of an electronic control module of a diesel engine, the plurality of wiring harness ports formed to accommodate at least two differently structured first wiring harnesses;
  a second connector configured for receiving a second wiring harness, the second wiring harness putting said second connector in circuit relationship to a diagnostic device;
  means for receiving a flash code of at least one attribute of at least one of the electronic control module and the diesel engine;
  an enclosure housing said at least one diesel engine control, said first connector, said second connector, and said receiving means; and
 powering the electronic control module and bypassing OEM-side controls of the electronic control module;
 the power box putting the electronic control module in circuit relationship to the power source and the at least one diesel engine control.

15. A method according to claim 14 further comprising the step of controlling a selected performance parameter of the diesel engine by way of the at least one control.

16. A method according to claim 14 further comprising the step of powering the electronic control module by way of the power box.

17. A method according to claim 14 further comprising the step of testing the electronic control module.

18. A method according to claim 14 further comprising a diagnostic device in circuit relationship to the power box.

19. A method according to claim 18 further comprising the step of programming the electronic control module by way of the diagnostic device.

20. A method according to claim 14 further comprising the step of starting the diesel engine by way of the power box.

21. A method according to claim 14 further comprising the step of obtaining diagnostic codes of the electronic control module directly from the power box.

* * * * *